Feb. 2, 1960 L. J. GIACOLETTO 2,923,868

SEMICONDUCTOR DEVICES

Filed July 22, 1954

INVENTOR.
LAWRENCE J. GIACOLETTO
BY
J. L. Whittaker
ATTORNEY

United States Patent Office 2,923,868

Patented Feb. 2, 1960

2,923,868

SEMICONDUCTOR DEVICES

Lawrence J. Giacoletto, Princeton Junction, N.J., assignor to Radio Corporation of America, a corporation of Delaware Application July 22, 1954, Serial No. 445,025

2 Claims. (Cl. 317—234)

Figure 1:
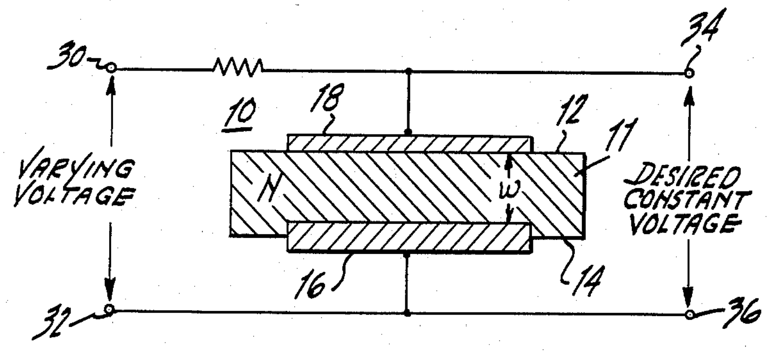

This invention relates to semiconductor devices and particularly to semiconductor diodes and their preparation.

A semiconductor diode known as a Zener diode is employed in electrical circuits for performing switching operations. A Zener diode comprises a crystal of semiconductor material having a rectifying and a non-rectifying electrode in contact with the crystal. The device is operated with the rectifying electrode electrically biased in the reverse direction with respect to the crystal.

As the reverse voltage of such a diode is increased from zero, the diode current, which is initially substantially negligible, increases very slowly until a certain critical voltage is reached. At this voltage, some internal mechanism, which is not well understood, causes the diode in effect to break down and the current therethrough increases very rapidly and substantially independently of voltage.

The aforementioned critical voltage which is known as the Zener voltage is determined by a number of factors, one of which is the resistivity of the semiconductor crystal. Thus, in effect, in order to prepare a diode having a predetermined critical Zener or breakdown voltage, a semiconductor crystal of a specific resistivity is employed. This is a situation which is not altogether desirable for manufacturing purposes. The optimum situation obtains when it is possible to prepare diodes having different breakdown voltages from a semiconductor crystal of a specific resistivity.

Accordingly, an important object of this invention is to provide a semiconductor device of new and improved form and a method of preparing such a device.

Another object is to provide an improved semiconductor diode.

A further object is to provide an improved semiconductor diode having a predetermined limiting or breakdown voltage.

In general, the principles and objects of this invention are accomplished by the provision of a semiconductor crystal having a rectifying electrode and a non-rectifying (ohmic) electrode spaced apart thereon. The rectifying and non-rectifying electrodes are spaced apart such a distance, that, the charge carrier exhaustion region associated with the area of contact between the rectifying electrode and the semiconductor crystal, in effect, contacts or short-circuits to the non-rectifying electrode at a predetermined voltage. This voltage is known herein as the breakthrough voltage. At this voltage, the device is essentially short-circuited and provides the type of limiting action characteristic of the Zener diode. In manufacturing the device, the electrode spacing can be varied so that this limiting voltage may have substantially any value smaller than that of the Zener voltage of the device.

Figure 2:
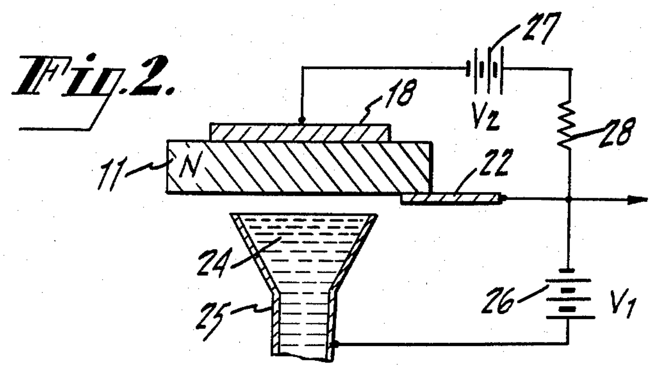

The invention is described in greater detail by reference to the drawing wherein:

Fig. 1 is a sectional elevational view of a device embodying the principles of the invention and a schematic circuit in which it may be operated; and, Fig. 2 is an elevational view of apparatus and a schematic representation of a circuit used in preparing the device of Fig. 1.

Referring to the drawing, a semiconductor diode 10 according to the invention comprises a semiconductor crystal 11 of germanium, silicon or the like of N-type or P-type conductivity. For the purposes of this description, the crystal 11 will be assumed to be of N-type germanium. The crystal may have substantially any shape, however, it is preferable that it have at least two substantially parallel, plane surfaces 12 and 14 on one of which e.g. 14, is soldered in low resistance contact a base electrode 16 which may comprise a plate of nickel, copper or the like.

A rectifying electrode 18 is provided in contact with the semiconductor crystal. The rectifying electrode may take any of the well known forms for such electrode. For example, it may be a surface barrier type electrode in the form of a point or a line or it may be a plate or film of the type described in U.S. Patent 2,634,322 to H. B. Law. In addition, the rectifying electrode may be an alloy or fusion type electrode such as that used in a transistor described in an article by Law, Mueller, Pankove and Armstrong entitled "A Developmental Germanium P–N–P Junction Transistor" and appearing on pages 1352 and 1357 of the Proceedings of the IRE of November 1952.

The rectifying electrode 18 preferably covers the entire area of surface 12 of crystal 11 and is separated from the crystal itself by a rectifying barrier region. This barrier region is also known as the exhaustion, or depletion layer because an electric field present therein repels the majority charge carriers out of the region so that it may be said to be depleted or exhausted of such charge carriers. In a loose sense, the rectifying barrier may be regarded as synonymous with the exhaustion layer but more strictly the barrier is a theoretical surface disposed within the exhaustion layer. The thickness and the exact location of the exhaustion layer depend upon the resistivities of the materials on either side of the barrier and upon the potential applied across the barrier. The thickness of the layer increases as the applied potential is increased in the reverse direction up to the break through voltage.

The electrodes 16 and 18 of the device 10 are arranged so that when the rectifying electrode 18 is biased at some predetermined voltage in the reverse direction, the exhaustion layer associated therewith thickens and, in effect, the space charge barrier associated therewith moves in the direction of the base electrode 16 and short-circuits to the base electrode. At this predetermined voltage, a large current flows through the diode 10 while the voltage across the diode remains substantially constant.

The device 10 having a predetermined breakthrough voltage and having a predetermined spacing between electrodes 16 and 18 may be prepared as follows: First, the crystal 11 is cut from an ingot and is prepared by etching in a bath comprising by volume 45% concentrated nitric acid, 45% concentrated hydrofluoric acid and 10% water. Before etching, the wafer may be of any convenient size such as about ¼" x ⅛" x .01" thick. It is etched to reduce its thickness to about .005" to .006" and to expose a fresh, crystallographically undisturbed surface.

Next, the rectifying electrode 18 is provided. This electrode may be formed by a process of the type described in the above-mentioned patent to H. B. Law or by an alloying process such as described in the above-mentioned IRE paper. According to the latter method, a disk of impurity material is placed on one surface of the wafer. The wafer and disk are heated together in a dry hydrogen atmosphere at about 500° C. for about 10 minutes to alloy the disk to the wafer and to form a rectifying barrier 8 in the wafer. The device thus formed is etched in an acid solution for about 30 seconds to expose the peripheral portions of the barrier. The etchant may be generally similar to the solution initially utilized to clean the surface of the wafer.

Next, the desired crystal thickness is provided by means of the circuit and apparatus shown in Figure 2. A non-rectifying connection 22 is made at some point, for example, at the periphery of the wafer or crystal 11. The surface 14 of the wafer opposite the rectifying electrode 18 is exposed to an electrolyte 24 such as a 2% sodium hydroxide solution. The electrolyte may be placed in the form of a drop upon the surface of the wafer or it may be sprayed on as by a jet 25 as shown, or, alternatively, the entire wafer may be immersed in a relatively large quantity of the electrolyte. An electrolyzing potential $V_1$ of about 2 to 5 volts is applied between the wafer and the electrolyte in an etching direction as by connecting a battery 26 between the non-rectifying contact 22 and the electrolyte. A biasing potential $V_2$ of a value which represents the selected breakthrough voltage of the completed device, for example about 5 volts, is applied by a battery 27 through a limiting and sampling resistor 28 between the rectifying contact and the wafer 11. The value of the biasing potential $V_2$ determines the resulting thickness of the etched wafer at which a control signal is produced across the resistor 28.

In operation, the biasing potential $V_2$ biases the rectifying electrode 18 in the reverse direction, thereby to increase the thickness of the barrier or exhaustion region to an extent determined by the potential and the resistivity of the semiconductive material. For example, in utilizing germanium of about 5 mhos/meter conductivity and a reverse bias potential of about 5 volts, the edge of the exhaustion region is extended about 10 microns into the wafer. When the thickness of the semiconductor crystal has been reduced by etching to correspond with this thickness of the exhaustion region, the edge of this region comes into contact with the electrolyte, and the current through the barrier and the sampling resistor 28 increases suddenly and rapidly. This relatively large increase in current through the resistor 28 is utilized to provide a signal to indicate that the penetration of the etching has reduced the wafer thickness to a particular value. The signal may readily be utilized to actuate automatic equipment to limit the etching.

The increase in current when the desired amount of etching has been achieved occurs because when the edge of the exhaustion region contacts the electrolyte the current in the wafer is limited principally by space charge instead of diffusion effects. As long as the wafer remains substantially thicker than the exhaustion region, the current through the wafer is limited by the rate of diffusion of charge carriers between the barrier and the surface being etched. The reverse bias potential initially appears across the barrier only and does not extend across the full thickness of the wafer or into the electrolyte. When the wafer thickness is reduced to the thickness of the exhaustion region, however, diffusion of charge carriers ceases to play a limiting part in the current flow, and the biasing potential appears across the entire thickness of the wafer. At this point the current through the barrier is limited primarily by the space charge effects in the material and the other parameters of the circuit.

The voltage at which the exhaustion region is extended to include the entire thickness of the base wafer will be referred to herein as the breakthrough voltage. Likewise, the point in the electroetching process when the etching reduces the thickness of the wafer to correspond to the thickness of the exhaustion region will be referred to as the breakthrough point.

Next, the crystal is removed from the etching apparatus whereupon the barrier region is reduced to a minimum value characteristic of the device in its non-operating state. The crystal 11 is then washed and the non-rectifying (ohmic) electrode 16 is soldered or otherwise bonded to the surface 14 opposite the rectifying electrode 18.

It is to be understood that the foregoing method may be employed to provide a semiconductor device having substantially any desired breakthrough or limiting voltage.

If desired, the thickness of the crystal W between the electrodes 16 and 18 may be computed approximately from the following equation:

$$W=[-2K_e\epsilon_o\mu]^{1/2}\sqrt{\frac{-V_p+V_{jB}}{\sigma_b}}$$

wherein:

$V_p$=a contact potential which is generally less than one volt and may be disregarded.

$K_e$=relative permittivity of the semiconductor material. =16 for germanium.

$\epsilon_o$=permittivity of free space$=\frac{1}{36\pi}\times10^{-9}\ \frac{\text{farads}}{\text{meter}}$ $\mu$=mobility of majority charge carriers in the semiconductor material.
=−0.36 meter 2/volt sec. for electrons in germanium.
=+0.17 meter 2/volt sec. for holes in germanium.

$\sigma_b$=conductivity of the semiconductor material.

$V_{jB}$=limiting or breakthrough voltage of the device.

Assuming that:

The crystal 11 is of N-type germanium;
$V_{jB}$=5 volts;
$\sigma_b$=5 mhos/meter.

Then W, or the spacing between electrodes 16 and 18 is approximately 10 microns when the device is designed for a limiting voltage of −5 volts.

Referring to Figure 1, the diode 10 may be employed as a voltage regulator in a circuit wherein a varying voltage appears across the device at terminals 30 and 32 and when the voltage reaches the breakthrough voltage for which the device is desired a large current flows therethrough and a substantially constant voltage appears at terminals 34 and 36.

As a modification of the diode of the invention, the ohmic or non-rectifying electrode 16 may be replaced by a rectifying electrode which may be similar to the electrode 18. In operation, the same type of breakthrough action is achieved in this modification of the invention as for the device 10 described above.

Although the principles of the invention have been described in relation to semiconductor diodes, it is to be understood that the same principles may be applied to other types of semiconductor devices such as triodes, tetrodes and the like.

What is claimed is:

1. A method of preparing a semiconductor device comprising a semiconductor crystal, a rectifying electrode in contact with a first surface of said crystal, said electrode having a barrier region associated therewith, and a second electrode in non-rectifying contact with another surface of said crystal, such that said device is adapted to conduct relatively large amounts of current at a voltage less than the Zener voltage of said crystal, said method comprising applying a predetermined voltage smaller than said Zener voltage in the reverse direction between said rectifying electrode and said crystal thereby thickening said barrier region a predetermined amount, removing the portion of said crystal between said barrier and said second surface thereby providing a new surface on said crystal, and connecting said non-rectifying electrode to said new surface.

2. A semiconductor device having a predetermined breakthrough voltage comprising a body of semiconductive material having first and second opposite surfaces, a rectifying electrode in contact with said first surface, and an ohmic electrode in contact with said second surface, said rectifying electrode being spaced about a distance W from said ohmic electrode where:

$$W=[-2K_e\epsilon_o\mu]^{1/2}\sqrt{\frac{-V_p+V_{iB}}{\sigma_b}}$$

wherein:

$K_e$=relative permittivity of the body.
$\epsilon_o$=permittivity of free space.
$\mu$=mobility of the majority charge carriers in said body.
$V_p$=contact potential.
$V_{iB}$=breakthrough voltage of the device.
$\sigma_b$=conductivity of the body.

References Cited in the file of this patent

UNITED STATES PATENTS 2,703,855 Koch et al. ---------------- Mar. 8, 1955